(12) United States Patent
Mourad et al.

(10) Patent No.: US 8,745,460 B2
(45) Date of Patent: Jun. 3, 2014

(54) ENCODING/DECODING APPARATUS AND METHOD

(75) Inventors: Alain Mourad, Staines (GB); Charly Poulliat, Cergy-Pontoise (FR); David Declercq, Cergy-Pontoise (FR); Kenta Kasai, Cergy-Pontoise (FR)

(73) Assignees: Samsung Electronics Co., Ltd., Suwon-si (KR); Ecole Nationale Superieure de l'Electronique et de SES Applications (ENSEA), Cergy-Pointoise (FR)

( * ) Notice: Subject to any disclaimer, the term of this patent is extended or adjusted under 35 U.S.C. 154(b) by 497 days.

(21) Appl. No.: 12/803,703

(22) Filed: Jul. 2, 2010

(65) Prior Publication Data

US 2011/0004811 A1 Jan. 6, 2011

(30) Foreign Application Priority Data

Jul. 2, 2009 (GB) .................................. 0911513.0

(51) Int. Cl.
*H03M 13/00* (2006.01)
(52) U.S. Cl.
USPC .......................................... 714/752; 714/781
(58) Field of Classification Search
None
See application file for complete search history.

(56) References Cited

U.S. PATENT DOCUMENTS

| | | | |
|---|---|---|---|
| 7,343,539 B2 | 3/2008 | Divsalar et al. | |
| 7,536,623 B2 * | 5/2009 | Kim et al. | 714/752 |
| 7,617,439 B2 * | 11/2009 | Shen et al. | 714/784 |
| 7,757,150 B2 * | 7/2010 | Stolpman | 714/752 |
| 7,814,403 B2 * | 10/2010 | Oh et al. | 714/800 |
| 7,995,667 B2 * | 8/2011 | Hansen et al. | 375/265 |
| 8,078,936 B2 * | 12/2011 | Yamagishi et al. | 714/755 |
| 2005/0204261 A1 * | 9/2005 | Kan et al. | 714/755 |
| 2006/0208930 A1 * | 9/2006 | Harada | 341/50 |
| 2007/0022354 A1 * | 1/2007 | Yu et al. | 714/755 |
| 2007/0136635 A1 * | 6/2007 | Niu et al. | 714/752 |

OTHER PUBLICATIONS

Declercq, D.; Fossorier, M.; , "Decoding Algorithms for Nonbinary LDPC Codes Over GF," Communications, IEEE Transactions on , vol. 55, No. 4, pp. 633-643, Apr. 2007.*
Kai-Li, et al.: "Low-Rate Repeat-Zigzag-Hadamard Codes", IEEE Transactions on Information Theory, vol. 54, No. 2, Feb. 2008, pp. 531-543.
Li Ping, et al.: "Low-Rate Turbo-Hadamard Codes", IEEE Transactions on Information Theory, vol. 49, No. 12, Dec. 2003, pp. 3213-3224.
Li Ping, et al.: "Zigzag Codes and Concatenated Zigzag Codes", IEEE Transactions on Information Theory, vol. 47, No. 2, Feb. 2001, pp. 800-807.

(Continued)

*Primary Examiner* — Steve Nguyen

(57) ABSTRACT

An encoder and a decoder employ an encoding scheme corresponding to a parity check matrix which is derivable from a bipartite protograph formed of variable nodes and check nodes, with each variable node corresponding to a codeword symbol position. The protograph has a plurality of groups of nodes, each group of nodes comprising both variable nodes and check nodes. Each of the check nodes in a group is of degree 2 and has connections to two variable nodes in the same group. The protograph also has a plurality of check nodes of degree n, where n is the number of said plurality of groups, wherein each of the plurality of check nodes has a connection to a variable node in each group such that the symbol positions in a codeword are interleaved between the groups of nodes.

20 Claims, 9 Drawing Sheets

Proposed protograph P1 for low rate codes.

(56) References Cited

OTHER PUBLICATIONS

Tom Richardson, et al.: "Multi-Edge Type LDPC Codes", IEEE Paper, Apr. 20, 2004, pp. 1-36.

Combined Search and Examination Report under Sections 17 and 18(3) dated Nov. 4, 2009 in connection with United Kingdom Patent Application No. GB0911513.0.

* cited by examiner

Proposed protograph P1 for low rate codes.

Proposed matrix structure for protograph of type P1.

Compressed representation P2 of the proposed protographs.

Compressed representation P2 of the proposed protographs, alternative representation

ENCODING/DECODING APPARATUS AND METHOD

CROSS-REFERENCE TO RELATED APPLICATION(S) AND CLAIM OF PRIORITY

The present application claims the benefit under 35 U.S.C. §119(a) to a United Kingdom patent application filed in the United Kingdom Patent Office on Jul. 2, 2009 and assigned Application No. 0911513.0, the entire disclosure of which is hereby incorporated by reference.

TECHNICAL FIELD OF THE INVENTION

The present invention relates generally to channel coding and decoding schemes for communication systems. The invention has relevance to low rate codes, i.e. codes where the ratio of information vector symbols to code vector symbols is small.

BACKGROUND OF THE INVENTION

Various forward error correction encoding schemes having low to very low rates have been proposed, including:
  Turbo-Hadamard codes as discussed in L. Ping et al., "Low rate turbo Hadamard codes", IEEE Transactions on Information Theory, Vol. 40, No. 12, December 2003, the contents of which are hereby incorporated by reference in its entirety;
  Zigzag Hadamard codes as discussed in L. Ping et al., "Zigzag codes and concatenated zigzag codes", IEEE Transactions on Information Theory, Vol. 47, No. 2, February 2001, and K. Li et al., "Low rate repeat zigzag Hadamard codes", IEEE transactions on Information Theory, Vol. 54, No. 2, February 2008, the contents of which are hereby incorporated by reference in its entirety; and
  multi-edge type low rate codes as discussed in T. Richardson, "Multi-edge Type LDPC codes", an online document which can be found at http://citeseerx.ist.psu.edu/viewdoc/download?doi=10.1.1.106.7310&rep=rep1&type=pdf, April 2004, the contents of which are hereby incorporated by reference in its entirety.

For "Low Density Parity Check" (LDPC codes), in general during encoding, a generator matrix G converts a message vector into a code vector by means of matrix multiplication. During decoding, a parity check matrix H is used which has the property such that matrix multiplication of the code vector by the parity check matrix H results in a null vector. For LDPC codes, the parity check matrix is sparse (i.e. it is largely populated by zeros).

A convenient way of representing an LDPC is in the form of a bipartite graph in which the nodes of the graph are separated into two distinct sets, referred to as variable nodes (v-nodes) and check nodes (c-nodes), with edges only connecting nodes of two different types. Such a graph is commonly called a Tanner graph. The number of v-nodes corresponds the size $N_v$ of the code vector. The number of c-nodes corresponds to the size $N_c$, of the parity check vector, which is given by $N_v - N_i$; where $N_i$ is the size of the information vector at the input of the encoder.

The girth of a Tanner graph is defined as the length of the smallest cycle in the Tanner graph. For good performance, it is desirable for the girth to be large.

The degree of a node is determined by the number of branches issued from and to the node.

One way of decoding an LDPC code is to use an iterative decoding algorithm, such as the belief propagation algorithm, which passes messages along the edges of such a graph. The values at a node are updated in accordance with messages received by that node. The iterations stop either when the check nodes correspond to a null vector or a default number of iterations have taken place.

LDPC coding designed over the Galois field GF(q) has been shown to approach the Shannon limit for performance when q=2 and the codeword lengths are very long. It has also been shown that for more moderate codeword lengths, efficient error decoding can be achieved by increasing q above 2, see for example L. Sassateli et al., "Low-rate Non-Binary LDPC Codes", Proceedings of IEEE Turbo-Coding Symposium, Lausanne, Switzerland, September 2008, the contents of which are hereby incorporated by reference in its entirety.

To aid the designing of improved LDPC codes, it has been proposed to derive an LDPC code using a protograph, which is effectively a Tanner graph with a relatively small number of nodes, as a template. See for example D. Divsalar et al., "Low rate LDPC codes with simple protograph structure", International Symposium on Information Theory (ISIT), 2005, the contents of which are hereby incorporated by reference in its entirety. The resulting LDPC code is sometimes referred to as a protograph code. The performance of a protograph can be comparatively easily analysed as it involves a small number of nodes, and this provides significant information on the performance of an LDPC code derived from the protograph.

SUMMARY OF THE INVENTION

To address the above-discussed deficiencies of the prior art, it is a primary aspect of the present invention to address the problem of providing an encoder/decoder utilising a new code which is simple yet powerful. Simple is a desired property from the perspective of the complexity of implementation (number of operations) of the encoder and decoder. Powerful is a desired property from the perspective of the code being able to correct errors incurred by channel distortions affecting signal transmission.

Aspects of the invention are set out in the accompanying claims.

An embodiment of the invention utilizes a protograph that includes following properties:
  The v-nodes and c-nodes are non-binary symbols from a Galois Field of arbitrary dimension q, being a prime number or a power of a prime number. This encompasses the most interesting values q=[32 . . . 256]. Other field orders may be less interesting due to high decoding complexity (q>256) or small performance improvement compared to binary codes (q<32).
  The v-nodes are positioned in groups onto three parallel distinct paths. The concept of a Layer composed of 3 parallel v-nodes is therefore introduced. The number of layers $N_l$ therefore equals $N_v/3$.
  The c-nodes in between the v-nodes are all of degree=2.
  The c-nodes at both edges are of degree=3.
  All v-nodes have constant degree=2, hence ensuring the protograph code falls into the class of cycle codes.
  The criterion used for the design of the Tanner graph underlying the channel code matrix is the one that achieves the maximum girth of the graph.

The non-zero values on the edges are chosen following the design rule (after graph girth maximization) of achieving an equivalent binary component code with maximum minimum Hamming distance and the best multiplicity of codewords for this minimum Hamming distance.

Additional and more efficient non-zero value assignment (as discussed in Poulliat et al: "Design of regular (2,dc)-LDPC codes over GF(q) using their binary images", IEEE Trans. Commun., vol. 56(10), pp 1626-1635, October 2008, hereby incorporated by reference in its entirety) is also compliant with the invention.

In an alternative embodiment of the invention, the protograph is compressed in order to reduce complexity.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

Figure 1:
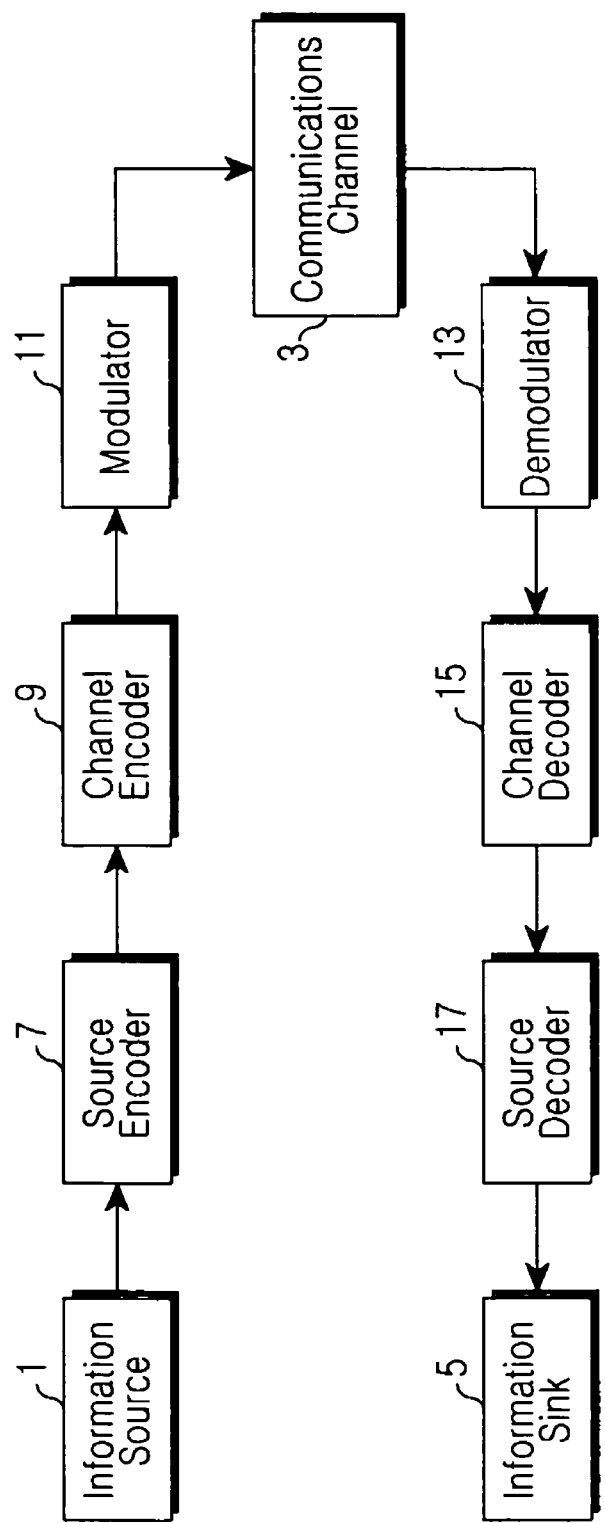
FIG. 1 illustrates the components of a communication system.

As illustrated in FIG. 1, the first embodiment of the invention will be described in the context of a typical communication system in which information from an information source 1 is transmitted through a communications channel 3 to an information sink 5. Prior to transmission through the communications channel 3, the information from the information source 1 is encoded by a source encoder 7 to represent the information efficiently, then encoded by a channel encoder 9 to take account of the transmission properties of the communications channel 3, and then input to a modulator 11 to generate a communication signal which is input to the communications channel 3. Following transmission through the communications channel 3, the communication signal is demodulated by the demodulator 13, decoded by the channel decoder 15 and then decoded by the source decoder 17.

In this embodiment the channel encoder 9 and the channel decoder 15 operate in accordance with a novel channel encoding scheme. The rest of the components of the communication system are conventional and will not be described in any more detail.

Figure 2:
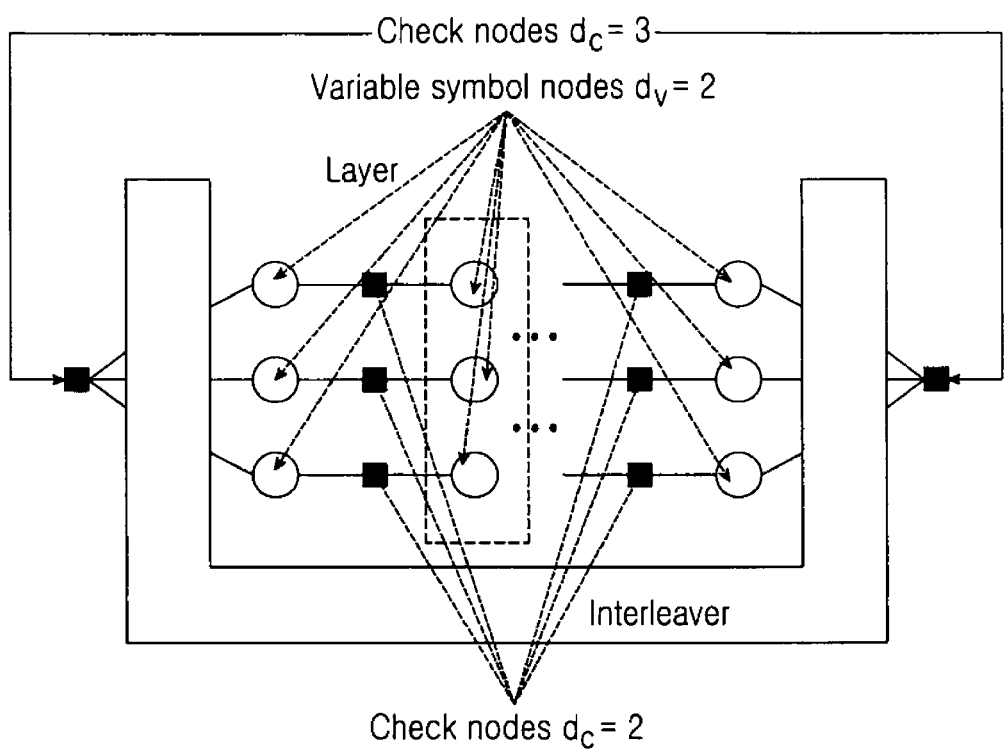
FIG. 2 illustrates a protograph according to a first embodiment of the invention.

The novel encoding scheme of this embodiment includes a parity check matrix which is derivable from the protograph $P_1$ illustrated in FIG. 2 in the form of a Tanner graph. In the protograph $P_1$, the v-nodes and c-nodes are non-binary symbols from a Galois field having dimension 256. The v-nodes are provided in three groups, with the v-nodes of the three groups being represented by three distinct parallel paths. The concept of a layer comprising three parallel v-nodes is therefore introduced. The number of layers $N_1$ is equal to $N_v/3$.

All v-nodes have constant degree=2, hence ensuring that the protograph code falls into the class of cyclic codes. The c-nodes between the v-nodes in each group are also all of degree=2. At each edge of the protograph $P_1$, a c-node of degree=3 is linked to a v-node in each of the three groups, represented at that edge of each of the three distinct paths. An interleaver is further applied so that the positions in a received code vector are interleaved between the different groups of nodes.

Figure 3:
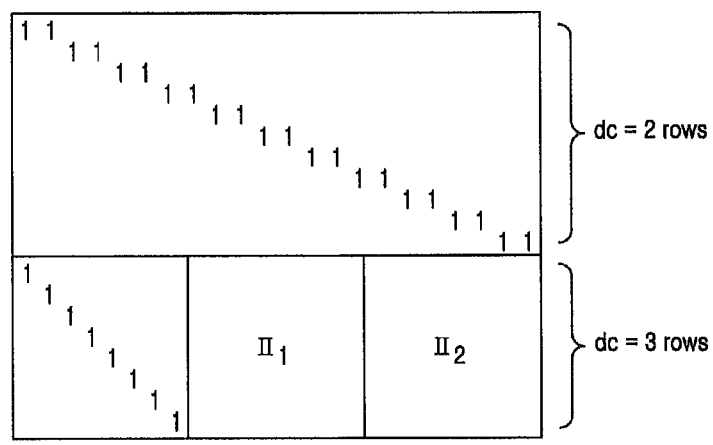
FIG. 3 illustrates a parity check matrix structure corresponding to the protograph illustrated in FIG. 2.

Based on the protograph of FIG. 2, several matrix constructions could be used. Since it has been shown that for ultra-sparse $d_v$=2 Non Binary (NB)-LDPC codes, the girth of the graph plays an important role, it is important to focus on graph constructions which achieve large girths. FIG. 3 shows a matrix structure for the case of a rate R=⅙ code. In FIG. 3, the "1"s represent non-zero values in the GF(256). The interleavers $\Pi_1$ and $\Pi_2$ can be designed in a pure random fashion, using a "lifting technique" or with a Progressive Edge-Generation (PEG) algorithm. In this embodiment, the criterion used for the design of the channel code matrix is the one that achieves the maximum girth of the graph. Table 1 below gives examples of the girth properties obtained with the protograph of FIG. 2:

TABLE 1

Girth properties of the protocode
obtained with protograph of FIG. 2

| | CODE | | | |
|---|---|---|---|---|
| | $R = \frac{1}{6}$ $K_b = 192$ $N_b = 1152$ | $R = \frac{1}{6}$ $K_b = 1000$ $N_b = 6000$ | $R = \frac{1}{12}$ $K_b = 192$ $N_b = 2304$ | $R = \frac{1}{12}$ $K_b = 960$ $N_b = 11520$ |
| girth | 32 | 40 | 64 | 80 |
| multiplicity | 44 | 26 | 54 | 26 |

After graph girth maximisation, the non-zero values on the edges are chosen using the technique discussed in Poulliat et al: "Design of regular (2,dc)-LDPC codes over GF(q) using their binary images", IEEE Trans. Commun., vol. 56(10), pp 1626-1635, October 2008, which is hereby incorporated by reference in its entirety and employed in this embodiment. This technique consists of considering all "shortest" cycles in the graph and choosing the non-zero values which appear in this cycle such that the binary image of the cycle is a full-rank square matrix. This optimisation algorithm has been shown to improve greatly the Frame Error Rate (FER) performance in the error-floor region. Additionally to this optimisation technique, the non-zero values which appear on a single row of the parity check matrix are chosen such that the equivalent binary component code has maximum minimum Hamming distance, and the best multiplicity for this minimum Hamming distance. Table 2 gives the best choice of non-zero values for the rows in the GF(256).

TABLE 2

Best choice for non-zero values for the rows in GF(256)

| | Field values | MinDist | Multiplicity |
|---|---|---|---|
| $d_c = 2$ | $\alpha^0, \alpha^8$ | 4 | 3 |
| | $\alpha^0, \alpha^{126}$ | 4 | 3 |
| | $\alpha^0, \alpha^{127}$ | 4 | 3 |
| | $\alpha^0, \alpha^{128}$ | 4 | 3 |
| | $\alpha^0, \alpha^{129}$ | 4 | 3 |
| | $\alpha^0, \alpha^{247}$ | 4 | 3 |
| $d_c = 3$ | $\alpha^0, \alpha^8, \alpha^{183}$ | 4 | 36 |
| | $\alpha^0, \alpha^{72}, \alpha^{80}$ | 4 | 36 |
| | $\alpha^0, \alpha^{175}, \alpha^{247}$ | 4 | 36 |

The achievable coding rates R are equal to: $R=1/(3*N_1)$. Note that these code rates are achieved without puncturing, and obtaining other code rates besides those is done by simple partial symbol puncturing along the paths shown in FIG. 2.

The simplicity of the structure of the protograph $P_1$ leads naturally to a rate compatible scheme. As can be seen from FIG. 2, removing a layer by puncturing increases the coding rate from $R=1/(3*N_1)$ to $R=1/(3*(N_1-1))$. It is also possible to achieve other coding rates by puncturing only 1 or 2 symbols within a layer instead of the entire layer. This puncturing strategy is optimal with respect to the protograph $P_1$ because it does not impact on the randomised part of the codes (i.e. where the interleaver acts), therefore keeping the girth structure and the chosen mother code. Accordingly, a significant advantage of the protograph $P_1$ is the ability to vary the coding rate without needing to change the mother code.

The choice of the non-zero values impacts on the graph properties when some symbols are punctured. If a symbol is punctured in one of the parallel paths of FIG. 2, the belief propagation decoder goes through 4 nonzero values from one noisy symbol to another instead of 2 when no symbol is punctured. This means in particular that products of several nonzero values that define a lower code rate should correspond to the optimum values of higher code rates. It therefore follows that a hierarchical optimisation of the nonzero values is advantageous to ensure that the nonzero values are optimally chosen for all code rates of interest. This hierarchical optimisation is simple to adapt from the existing literature.

Figure 4:
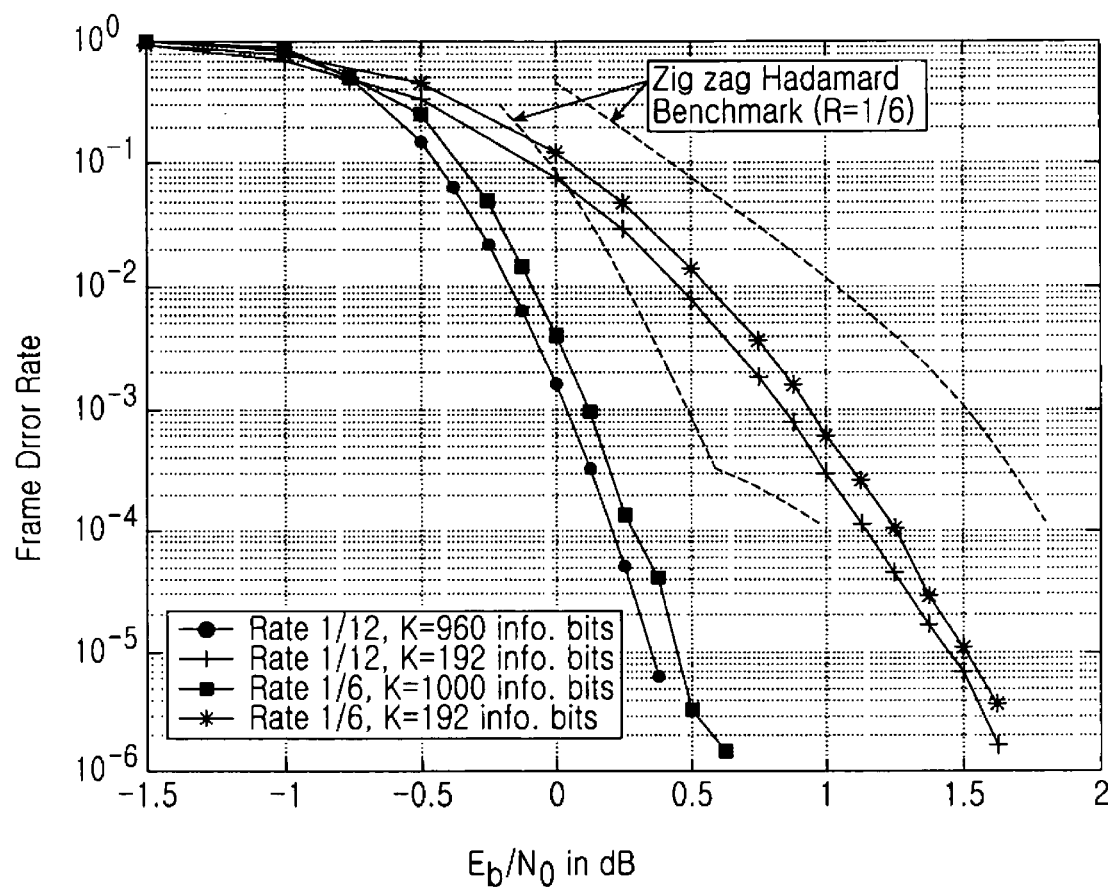
FIG. 4 illustrates performance results of protograph codes according to the first embodiment.

The performance of the proposed codes will now be discussed with reference to FIGS. 4 to 7. FIG. 4 shows the performance of four Protocodes according to the invention with the performance of Zig-zag Hadamard codes used as a benchmark. The gain achieved is up to 0.5 dB for the same decoding complexity. Although not shown in FIG. 4, the performance of binary protograph based LDPC codes for rate $R=\frac{1}{6}$ is 0.1-0.2 dB better than the Zig-Zag Hadamard codes in the waterfall region, and with no measured error floor. This means that the non-binary protograph of the present embodiment is capable of 0.3 dB to 0.5 dB gain in the two regions compared to binary protograph codes for this specific rate. Binary protograph solutions tend to have error floors at lower rates, and no existing scheme other than Hadamard based codes are published under rate $R=\frac{1}{10}$.

Figure 5:
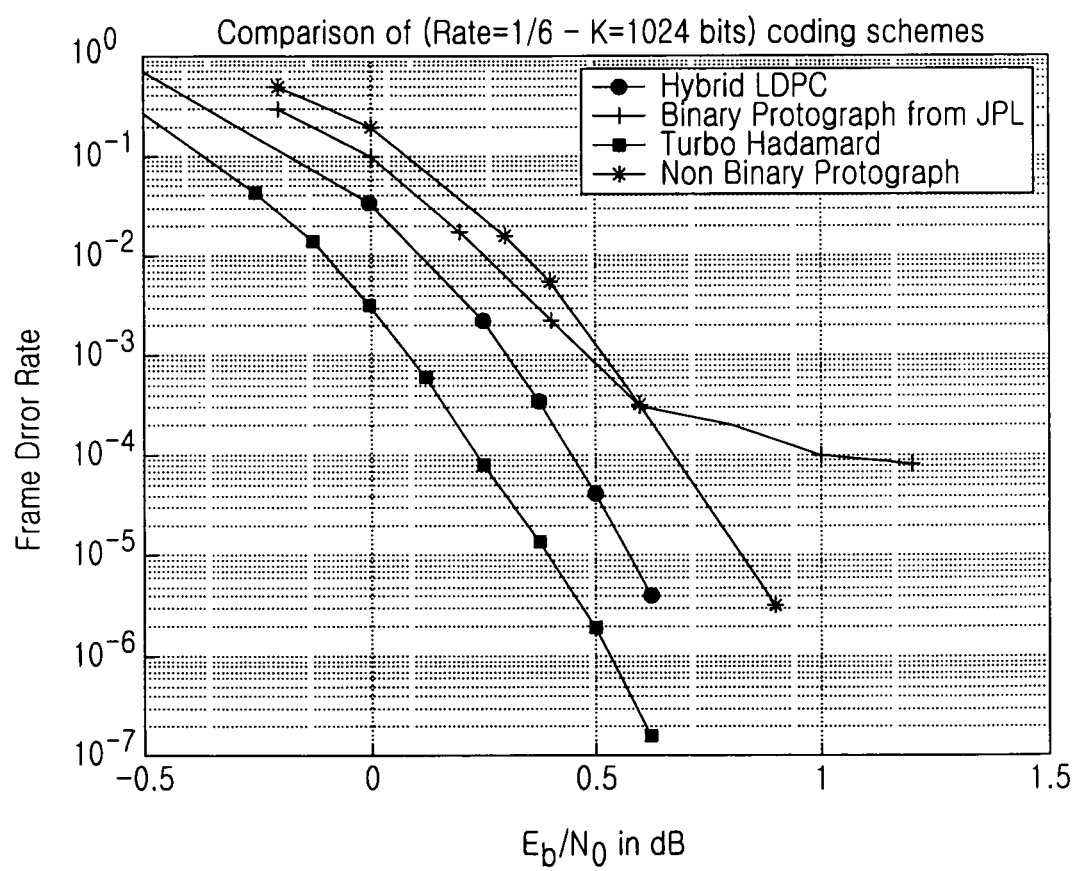
FIG. 5 illustrates a graph comparing the performance various codes having rate=⅙ and 1024 information bits including a protograph code according to the first embodiment.

FIG. 5 shows the performance of a Non-Binary Protograph code according to the invention having rate=$\frac{1}{6}$ and 1024 information bits in comparison with a Turbo-Hadamard code, a Binary Protograph code and a Hybrid LDPC code all having the same rate and information bits. From FIG. 5, it can be seen that Non-Binary Protograph codes according to the invention are capable of outperforming other codes.

Figure 6:
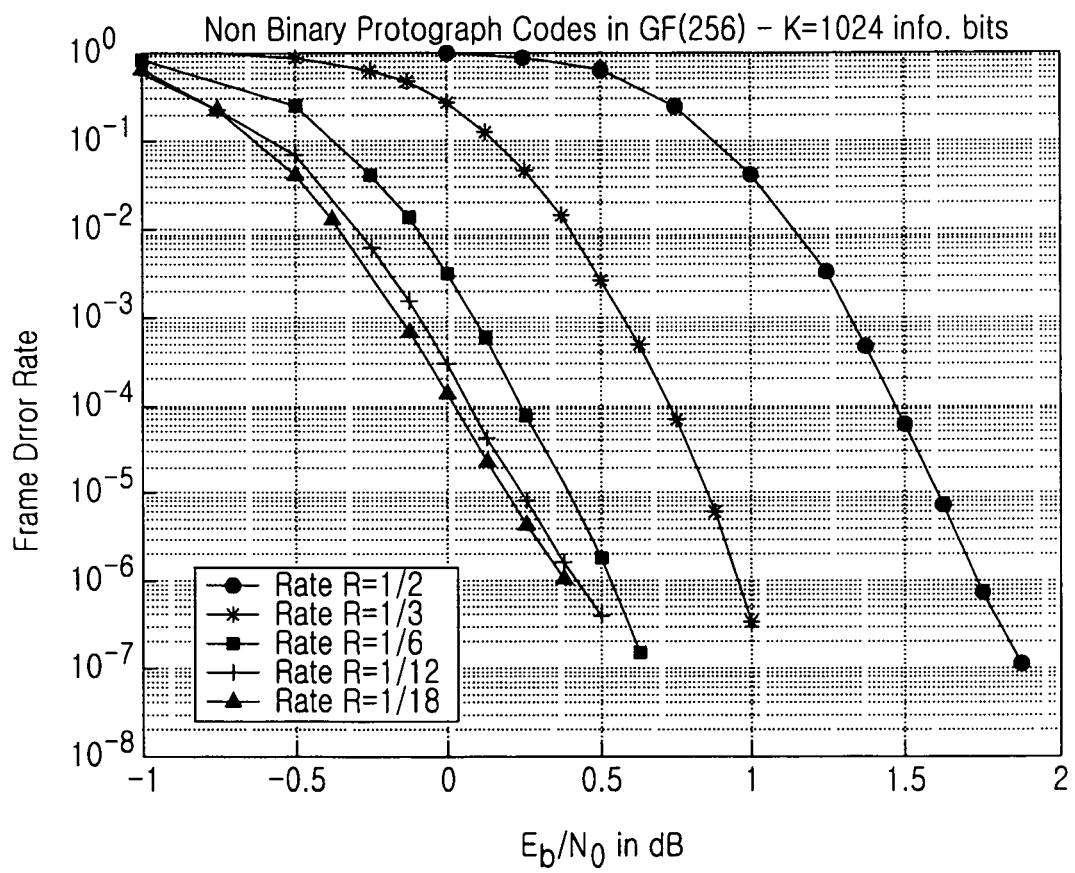
FIG. 6 illustrates a graph comparing the performance of protograph codes according to the present invention in GF(256) with 1024 information bits at different rates.
Figure 7:
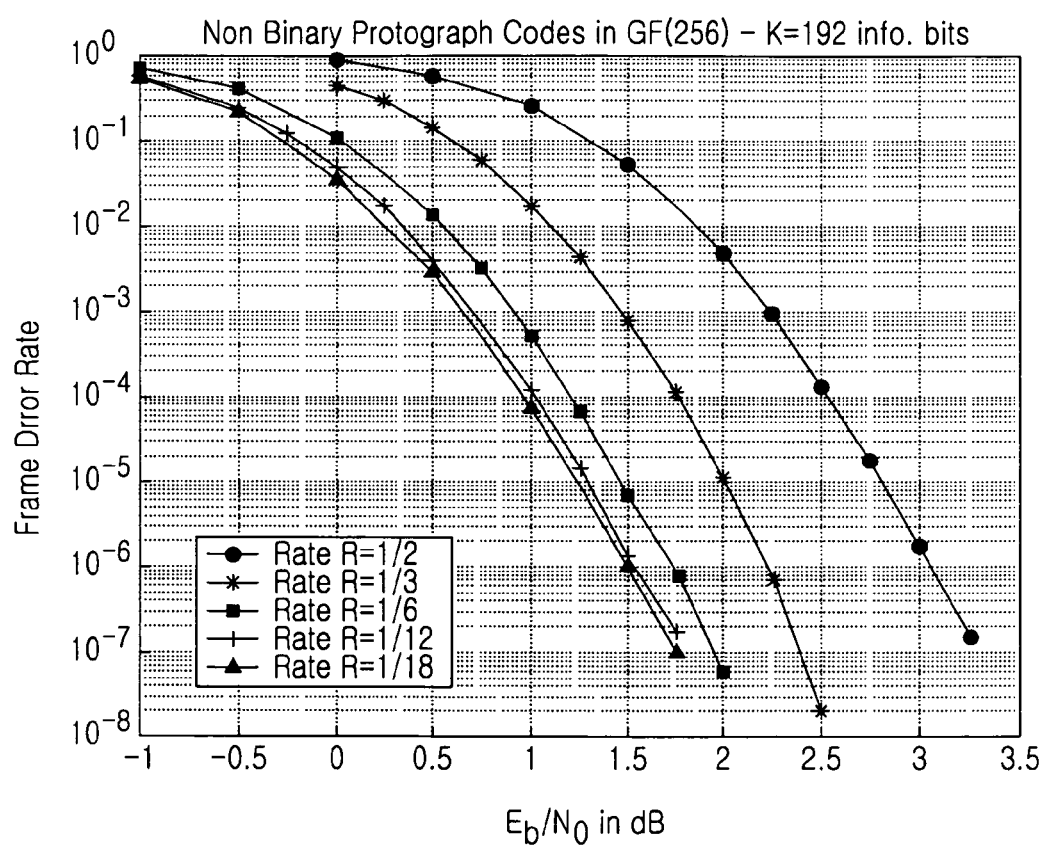
FIG. 7 illustrates a graph comparing the performance of protograph codes according to the present invention in GF(256) with 192 information bits at different rates.

FIGS. 6 and 7 show the performance of non-binary protograph codes in GF(256) with 1024 information bits and 192 information bits respectively for different code rates.

Figure 8:
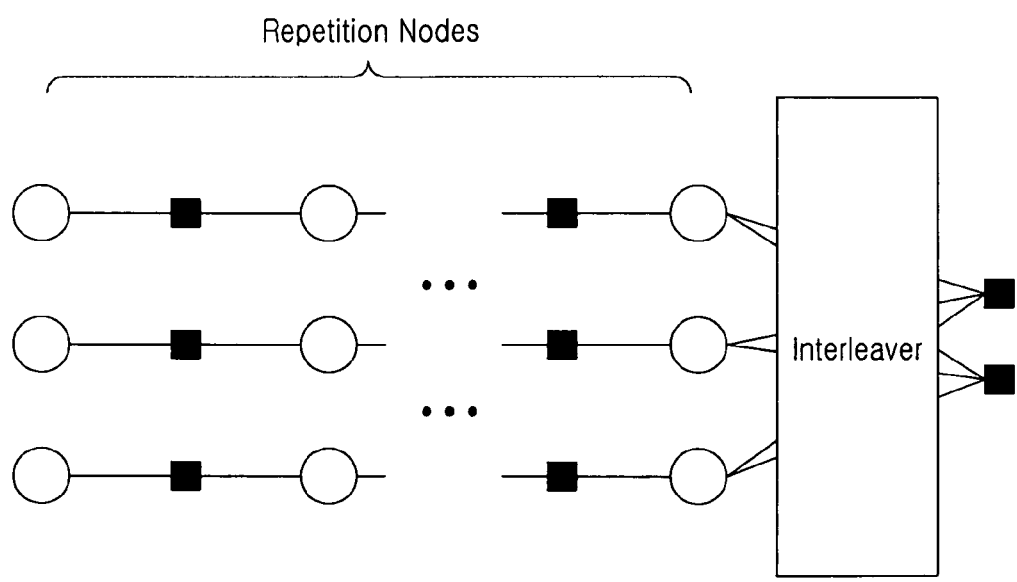
FIG. 8 illustrates a protograph according to a second embodiment of the invention.

A second embodiment will now be described in which, in order to reduce the complexity of the protograph $P_1$, an alternative protograph $P_2$ is proposed, the Tanner graph of which is illustrated in FIG. 8. The protograph $P_2$ is a compressed form of the protograph $P_1$. This allows a lowering of the number of operations performed by the decoder.

The protograph $P_2$ can be interpreted in terms of general non-binary repetition codes. In finite fields GF(q), a repetition node is not a trivial code and actually corresponds to a binary component code. In that sense, non-binary repetition nodes should be optimised with the technique described for protograph $P_1$.

The protograph $P_2$ is not equivalent to the protograph $P_1$. Some degree of freedom is lost when compressing the representation from protograph $P_1$ to protograph $P_2$. The protograph $P_1$ actually belongs to a wider family of codes, i.e. several distinct protographs of type $P_1$ could be compressed into the same protograph $P_2$.

It is harder to optimise the graph and the non-zero values with the protograph $P_2$, and indeed a direct optimisation of protograph $P_2$ may give poor performance results. Given this, in this embodiment a protograph of type $P_1$ was optimised using the PEG algorithm and a choice of non-zero values, and the resultant protograph was compressed to derive protograph $P_2$. The belief propagation algorithm was then applied to protograph $P_2$.

The protograph $P_2$ can be viewed as the serial concatenation of a regular rate $R=\frac{1}{3}$ ultra-sparse non-binary LDPC code followed by several repetition codes per variable node. As such, easy encoding procedures can be derived (i.e. linear in time). For encoding, we can consider two different cases:

In a first example, the rate one-third outer code is not linearly encodable. In this example, a generator matrix is required to encode first the rate one-third part of the code, and then the repetition variables are easily produced from the obtained coded variable nodes. Note that any arbitrary rate R less or equal to ⅓ is achievable by producing "on demand" redundancy symbols based on simple repetitions. The "on demand" redundancy repetition is formally equivalent to symbol puncturing in structure $P_1$, therefore ensuring total compliance between protograph $P_1$ and protograph $P_2$.

In a second example, the rate one-third outer code is linearly encodable. This example can be enforced with specific structures for the outer code. It could be optimised with a PEG algorithm with a constraint of linearly encodable code (e.g. "directly encodable"), or obtained as a structured ultra-sparse Repeat-Accumulate code. Since the inner code is based on simple repetitions, the overall coding scheme based on protograph $P_2$ is linearly encodable.

From the point of view of complexity of encoder and decoder, protograph $P_2$ enjoys a lower complexity than protograph $P_1$. In particular, the decoding complexity of protograph $P_2$ is independent of the coding rate and is exactly equal to the decoding complexity of the mother code (of rate $R=⅓$ in this embodiment). This property is itself a new and innovative improvement. However, the design of the encoder for protograph $P_2$ is more complex than for protograph $P_1$ because fewer degrees of freedom are available after compression and that means it can be quite difficult to find the best choice for the non-zero values at the edges.

In terms of performance, the protograph P2 achieves similar performance to the protograph P1 at a lower decoding complexity (lower number of operations for the decoding). Accordingly, it also can outperform existing systems.

In terms of rate compatibility, protograph P2 preserves the properties of protograph P1 as increasing the rate from a very low rate mother code defined with several repetition nodes is achieved by using a portion of the repetition nodes in the encoding procedure.

Figure 9:
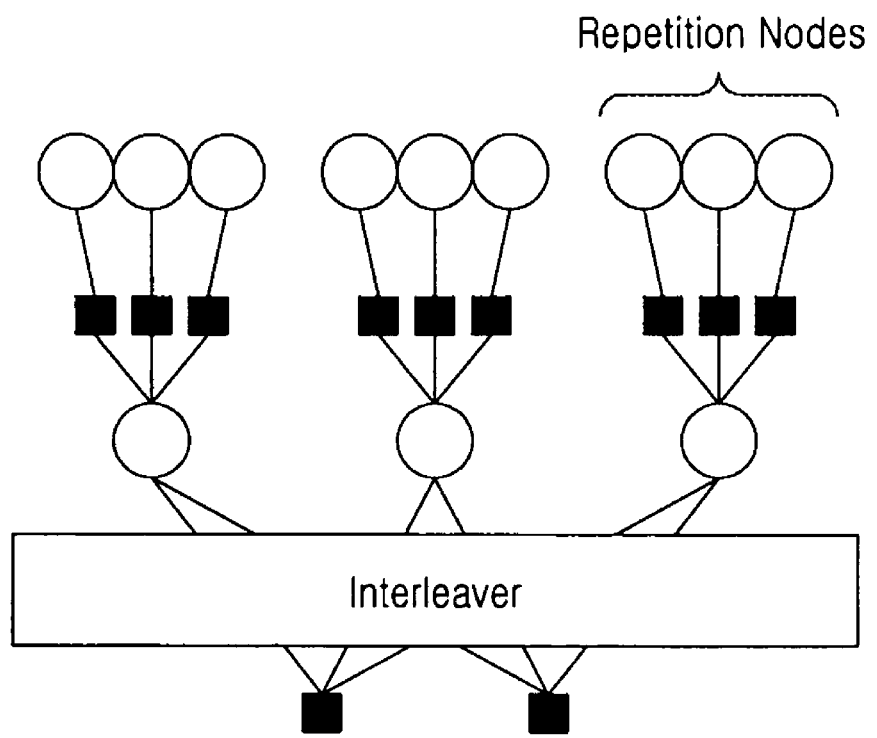
FIG. 9 illustrates a protograph according to a third embodiment of the invention.

FIG. 9 shows a protograph $P_3$ used in a third embodiment of the invention. The protograph $P_3$ is equivalent to the protograph $P_2$.

MODIFICATIONS AND FURTHER EMBODIMENTS

Although in the described embodiments the v-nodes and the c-nodes are non-binary symbols from a Galois field having dimension 256, other field orders may be used. It is preferred that the field order is in the range from 32 to 256 because for field orders above 256 the decoder complexity becomes problematic and for field orders below 32 the performance improvement compared to binary codes is small. However, in principle any field order could be used, and indeed the invention can be applied to v-nodes and c-nodes having binary symbols.

It will be appreciated that other techniques for assigning non-zero values to edges could be used, for example a lifting technique or the Progressive Edge-Generation (PEG) algorithm. Alternatively, the non-zero values could simply be assigned randomly.

The described embodiments utilise a belief propagation algorithm to perform error detection and correction. Those skilled in the art will appreciate that other types of Message Passing Algorithm could be applied. An alternative decoding algorithm which could be used is the Extended Minimum Sum (EMS) algorithm discussed in Declercq and Fossorier: "Decoding Algorithms over Nonbinary LDPC Codes over GF(q)", IEEE Transactions on Communications, Vol. 55, No 4, pp 633-647, the contents of which are hereby incorporated by reference in its entirety.

While in the described embodiment the v-nodes are split into three groups, it will be understood that the v-nodes could be split into two groups or a larger number of groups.

Encoders and decoder implementing the invention may comprise a processing apparatus and the invention may involve processes performed in the processing apparatus. The invention also extends to computer programs, particularly computer programs on or in a carrier, adapted for putting the invention into practice. The program may be in the form of source code, object code, a code intermediate to source code and object code such as in partially compiled form, or in any other form suitable for using in the implementation of the processes according to the invention.

The carrier may be any entity or device capable of carrying the program. For example, the carrier may comprise a storage device, such as a ROM, for example a CD-ROM or a semiconductor ROM, or a magnetic recording device, for example a floppy disc or a hard disc, or an optical recording device. Further, the carrier may be a transmissible carrier such as an electronic or optical signal which may be conveyed via electrical or optical cable or by radio or other means.

The carrier may be an integrated circuit in which the program is embedded, the integrated circuit being adapted for performing, or for use in the performance of, the relevant processes.

Although the invention may be implemented by software, it will be appreciated that alternatively the invention could be implemented by hardware devices or a combination of hardware devices and software. Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An encoder comprising:
an input interface configured to receive a data stream;
a processor configured to map the received data stream into corresponding codewords; and
an output interface configured to output said codewords,
wherein said processor is configured to map packets of the received data stream, each packet comprising a sequence of packet symbols, into respective codewords, each codeword comprising a sequence of codeword symbols, using an encoding scheme corresponding to a parity check matrix that is derived from a bipartite protograph,
wherein the bipartite protograph comprises:
a plurality of groups of nodes, each group of nodes comprising variable nodes and a first plurality of check nodes, each variable node corresponding to a codeword symbol position, wherein each of the check nodes in the first plurality of check nodes is of degree two and is connected to two variable nodes in the same group and wherein each of the groups of nodes forms a parallel path in the bipartite protograph, wherein each variable node in the bipartite protograph belongs to one of the groups of nodes; and
a second plurality of check nodes of degree n, n being the number of said plurality of groups, wherein each of the second plurality of check nodes is connected to a variable node in each group such that the codeword symbol positions in each codeword are interleaved between the groups of nodes.

2. The encoder according to claim 1, wherein the second plurality of check nodes of degree n consists of two check nodes.

3. The encoder according to claim 1, wherein the second plurality of check nodes of degree n are connected to respective different symbol nodes in each group.

4. The encoder according to claim 1, wherein the check nodes in the second plurality of check nodes are connected to a same symbol node in each group of nodes.

5. The encoder according to claim 1, wherein the plurality of groups of nodes consists of three groups of nodes.

6. The encoder according to claim 1, wherein the processor is further configured to adjust a coding rate by puncturing the codeword symbols while maintaining the encoding scheme.

7. The encoder according to claim 1, wherein the processor is further configured to process the received data stream to generate the packets comprising sequences of packet symbols, with each symbol being from a Galois field of dimension q, and to map the packets into codewords formed of symbols in a Galois field of dimension q, wherein q is in the range from 32 to 256.

8. The encoder according to claim 1, wherein at least one of the packet symbols and the codeword symbols are binary symbols.

9. The encoder according to claim 1, wherein the encoding scheme is stored in a memory.

10. The encoder according to claim 1, wherein non-zero values in the parity check matrix are assigned based on a Progressive Edge-Generation (PEG) algorithm.

11. A decoder comprising:
an input interface configured to receive a stream of codewords, each codeword comprising a sequence of codeword symbols;
a processor configured to decode the codewords to recover data packets; and
an output interface configured to output said data packets, each packet comprising a sequence of packet symbols,
wherein the processor is configured to recover said data packets using a parity check matrix that is derived from a bipartite protograph,
wherein the bipartite protograph comprises:
a plurality of groups of nodes, each group of nodes comprising a plurality of variable nodes and a first plurality of check nodes, each variable node corresponding to a codeword symbol position, wherein each of the check nodes in the first plurality of check nodes is of degree two and is connected to two variable nodes in the same group and wherein each of the groups of nodes forms a parallel path in the bipartite protograph, wherein each variable node in the bipartite protograph belongs to one of the groups of nodes; and
a second plurality of check nodes of degree n, n being the number of said plurality of groups, wherein each of the second plurality of check nodes is connected to a variable node in each group such that the codeword symbol positions in each codeword are interleaved between the groups of nodes.

12. The decoder according to claim 11, wherein the second plurality of check nodes of degree n consists of two check nodes.

13. The decoder according to claim 11, wherein the second plurality of check nodes of degree n are connected to respective different symbol nodes in each group.

14. The decoder according to claim 11, wherein the check nodes in the second plurality of check nodes are connected to a same symbol node in each group of nodes.

15. The decoder according to claim 11, wherein the plurality of groups of nodes consists of three groups of nodes.

16. The decoder according to claim 11, wherein the processor is further configured to process the received data stream to generate the packets comprising sequences of packet symbols, each symbol being from a Galois field of dimension q, and to map the packets into codewords formed of symbols in a Galois field of dimension q, wherein q is in the range from 32 to 256.

17. The decoder according to claim 11, wherein at least one of the packet symbols and the codeword symbols are binary symbols.

18. The decoder according to claim 11, wherein the processor is further configured to execute a belief propagation algorithm to perform error detection and correction.

19. The decoder according to claim 11, wherein a decoding scheme executed by the processor is stored in a memory.

20. The decoder according to claim 11, wherein the processor is further configured to execute an Extended Minimum Sum (EMS) algorithm to perform error detection and correction.

* * * * *